United States Patent [19]

Snead

[11] Patent Number: 5,142,234
[45] Date of Patent: Aug. 25, 1992

[54] PARTICLE BEAM ACCELERATOR ELECTROMAGNETIC ARC DETECTION SYSTEM

[75] Inventor: Robert A. Snead, Huntsville, Ala.

[73] Assignee: The United States of America as represented by the Secretary of the Army, Washington, D.C.

[21] Appl. No.: 783,607

[22] Filed: Oct. 28, 1991

[51] Int. Cl.$^5$ .................. H01J 23/00; H02H 3/20
[52] U.S. Cl. .................. 324/536; 328/233; 361/91; 376/340; 324/522
[58] Field of Search .................. 324/520, 522, 536; 328/233; 89/8; 124/3; 361/91, 113; 376/340, 305

[56] References Cited

U.S. PATENT DOCUMENTS

| | | | |
|---|---|---|---|
| 3,590,250 | 6/1971 | Witkover | 328/233 |
| 4,343,010 | 8/1982 | Denny et al. | 361/91 |
| 4,700,108 | 10/1987 | Morse | 328/233 |
| 4,841,406 | 6/1989 | Stierberger | 361/91 |
| 4,982,320 | 1/1991 | Eaton et al. | 328/233 |
| 5,047,724 | 9/1991 | Boksiner et al. | 324/520 |

FOREIGN PATENT DOCUMENTS 1102478  6/1985  U.S.S.R. .................. 328/233

Primary Examiner—Kenneth A. Wieder
Assistant Examiner—Maura K. Regan
Attorney, Agent, or Firm—Hugh P. Nicholson; Freddie M. Bush

[57] ABSTRACT

Low frequency broadband energy is separated from an accelerator structure fundamental radio frequency (rf) energy in the broadband electromagnetic energy within specific frequency bands. The particle beam accelerator electromagnetic arc detection system comprises employing signal lines extended from existing particle beam accelerator diagnostic sensors to electrical filter circuits. Depending on the application requirements, filters are grouped by types such as low-pass, high pass, or bandpass types. The bandpass filters are employed in banks in a preferred embodiment to reject all electrical signals except those within the band of interest. The increase in broadband electromagnetic energy radiated through the accelerator structure as an arc begins to form is readily detectable in the rf spectrum at frequencies below 10 MHz. The electrical signals received by the filters are subsequently passed to detectors which produce a direct current (DC) level proportional to the strength of the signal. The outputs from the rf detectors are then fed to processing logic. When the selected set of rf detectors becomes active, the processor declares an arc condition and produces appropriate signals to inform the main system processor which initiates protective action (e.g., crowbar the high voltage by power supply protection circuitry).

3 Claims, 1 Drawing Sheet

PARTICLE BEAM ACCELERATOR ELECTROMAGNETIC ARC DETECTION SYSTEM

DEDICATORY CLAUSE

The invention described herein may be manufactured, used, and licensed by or for the Government for governmental purposes without the payment to me of any royalties thereon.

BACKGROUND OF THE INVENTION

Nuclear particle accelerators, such as the Neutral Particle Beam (NPB) and Free Electron Laser (FEL) utilize large electrostatic or time varying electromagnetic fields to transfer energy from the electromagnetic field to particle velocity. Size constraints for orbital weapons platforms, considered with the high particle velocities required, drive designers to utilize large gradient electromagnetic fields in the accelerating structures. These large field gradients sometimes lead to electric field breakdown and resulting arc discharges between accelerator components. In order to minimize damage to the accelerator structure resulting from such discharges, it is desirable to detect and extinguish the discharge as soon as possible after it begins.

Present accelerators accomplish arc detection by sensing the optical emissions (ultraviolet or infrared) from the arc, by detecting anomalies in the amount of rf (radio frequency) power reflected by the accelerating structure, or by detecting surges in the rf amplifier electrical power. Each of these methods has disadvantages. Optical detectors must be placed inside the accelerating cavity and may not be within line of sight of the arc. Reflected rf power anomalies unrelated to arc discharges are common in particle accelerators so careful attention must be given to the problem of classifying the anomalies to ensure reliable arc recognition. Sensing surges in the rf amplifier prime power introduces delay proportional to the amount of energy storage (capacitance) designed into the power supply.

A technique for recognizing particle accelerator cavity arcs which does not require optical detectors would be advantageous. Since the optical detectors function by measuring optical emissions (ultraviolet or infrared) from the arc, the optical detectors must be placed within the accelerating cavity; however, a restriction for this type arc detection is a requirement that the optical detectors may not be within the line of sight of the arc. If the optical arc detector is not within the line of sight, an arc may be taking place, but the arc is not detected.

An object of this invention is to provide a detection system for particle accelerator cavity arcs based on a recognition of the electromagnetic spectrum of arc discharges.

Specifically, another object of this invention is to provide a detection system for particle accelerator cavity arcs at the time the arc begins to form.

SUMMARY OF THE INVENTION

The increase in the broadband electromagnetic energy is detectable as the arc begins to form in the rf spectrum at frequencies below 10 megahertz (MHz). In accordance with this invention, the low frequency broadband energy is separated from the accelerator structure fundamental rf energy and detected by one or more sensors designed to detect changes in broadband electromagnetic energy within specific frequency bands. Since simultaneous excitation of multiple frequency bands is characteristic of arc phenomena, a plurality of sensors are provided for as further described below.

The arc detection system provides a non intrusive technique, i.e., the sensor does not have to be installed in the accelerator structure. The sensor can be integrated with sensors installed for other purposes. The only requirement is that the arc sensor be connected to an electrical or rf signal line lead to or from the accelerator cavity. Thus, rf signal lines are connected to electrical filter circuits. Depending on the application, these filters may be low-pass, high pass or bandpass filters. The number of filters implemented are application specific. The filters function by rejecting all electrical signals except those within the band of interest. The electrical signals from the filters are passed to detectors which produce a DC level voltage proportional to the strength type of the signal. The detector outputs are routed to a processor unit which declares an arc condition. The processor subsequently produces appropriate signals to inform a main system processor which initiates protective action such as a triggered crowbar action when a preset current or voltage is exceeded.

DESCRIPTION OF THE PREFERRED EMBODIMENT(S)

The technique for recognizing particle accelerator cavity arcs is based on a recognition of the electromagnetic spectrum of arc discharges. An increase in broadband electromagnetic energy radiated through the accelerator structure as an arc begins to form is detectable in the rf spectrum at frequencies below 10 MHz. In accordance with the invention circuitries, the described low frequencies broadband energy levels are separated from the accelerator structure fundamental rf energy. Detection of changes in broadband electromagnetic energy within specific frequency bands is a requirement since simultaneous excitation of multiple frequency bands is characteristic of arc phenomena.

Figure 1:
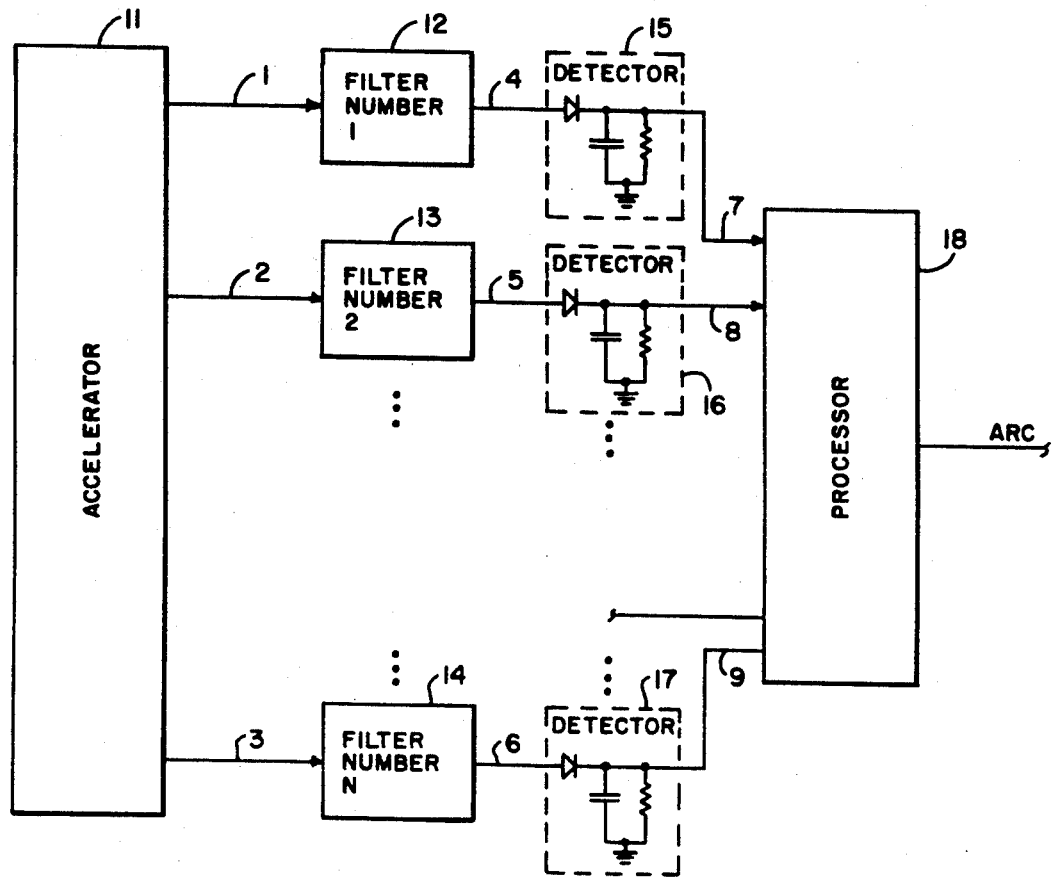
FIG. 1 is a system configuration 10 for particle beam accelerator electromagnetic arc detection system.

In further reference to the Figures of the Drawing, FIG. 1 depicts a schematic illustration of the particle beam electromagnetic arc detection system 10 in association with an accelerator 11 with which the protection circuitry is hard wired. Prior to the detailed description of the invention, the following comments places emphasis on the advantages of the detection system and how it functions to rapidly detect electrical arc discharges, even at the time of formation, and the importance of such detection for personnel safety or equipment protection.

The system and method of using same offers the following advantages:

a. This system offers an improvement over the detection speed of conventional systems. Propagation from the arc to the sensor is speed of light. Recognition of the arc spectrum is limited only by the electronics delay. Processing time is eliminated, allowing accelerator protection circuitry to be "hard wired". Since the detection scheme is not optical, line of sight to the arc is not required.

b. This system is non intrusive. The sensor does not have to be installed in the accelerator structure. The sensor can be integrated with sensors installed for other purposes. The only requirement is that the arc sensor be connected to an electrical or rf line leading to or from the accelerator cavity.

c. This system can be utilized with any accelerator diagnostics instrumentation scheme. Since the arc detection circuitry senses broadband noise which is usually rejected from the diagnostics instrumentation, it can be applied readily to any instrumentation line from electrical sensors in the accelerator.

d. This system is not subject to false indications by extraneous flashes such as with an optical system.

Figure 2:
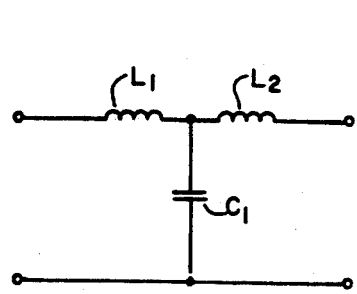
FIGS. 2 and 3 depict a discrete filter circuit and an active filter circuit of the prior art, each of which is the bandpass.
Figure 3:
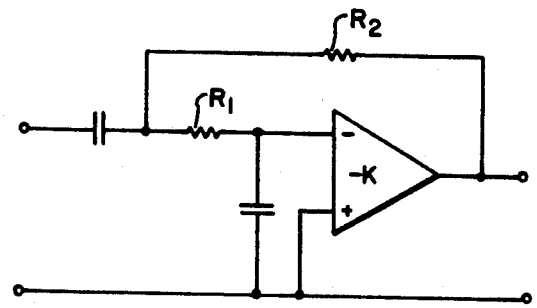

As illustrated in FIG. 1, first signal lines 1-3 are connected between existing particle accelerator diagnostic sensors (not shown) of illustrated accelerator 11 and electrical filter circuits 12-14. Depending on the application, prior art filters may be low-pass, high pass or bandpass types. The prior art filters shown as examples in FIGS. 2 and 3 are of the bandpass type. FIG. 2 depicts a discrete filter, and FIG. 3 depicts an active filter. The number of filters implemented are application specific and can be optimized for a particular designed criteria. The filters reject all electrical signals except those within the bands of interest. The passing of signals to rf detectors can result in a set of rf detectors becoming active when certain frequency bands of energy are acted on.

In further reference to a typical prior art discrete filter of FIG. 2, a capacitor $C_1$, is shown connected in parallel and inductive coils $L_1$ and $L_2$ are shown connected in series with a load or signal line. FIG. 3 depicts a typical prior art active filter employing passive network elements in combination with an amplifier. This filter is used for transmitting or rejecting signals in certain frequency ranges, or for controlling the relative output of signals as a function of frequency. Typically a condenser opposes any change in voltage across its terminals (across the load) by storing up energy in its electrostatic field whenever the voltage tends to rise and by converting this stored energy back into voltage whenever the load tends to decrease. Typically, an inductive coil or an inductor apposes a change in current through it (through the load) by storing up energy in its electromagnetic field when the current tends to increase and by taking energy from the magnetic field to maintain the flow when the voltage tends to decrease.

Thus, the filters are arranged in bands as depicted in FIG. 1, such as 1, 2, . . . n filters, to pass energy which falls within the frequency band of interest, while rejecting other signals such as the accelerator fundamental rf operating frequency. As further depicted in FIG. 1, the output from each filter band is then fed through second signal lines 4-6 to an rf detector which produces a DC level output proportional to the amplitude of the signal (broadband noise) received. As depicted in FIG. 3, the direct current (DC) output or other output can be amplified prior to being fed to a detector which can further amplify the input signal as required prior to being fed to the processing logic of processor 18 depicted in FIG. 1.

The electrical signals from the filters are passed through detectors 15-17 which produce a DC level proportional to the strength of the signal. The detector outputs are routed (with amplification as required) through third signal lines 7-9 to a processor unit 18 which declares an arc condition. A main system processor (not shown) then initiates protective action (e.g. crowbar the high voltage by standard power supply protection circuitry, not shown).

Thus, the particle beam accelerator electromagnetic arc detection system functions in accordance with the following description of a typical operational cycle of events and appropriate taken. Upon initiation of an arc in the accelerator structure, broadband electromagnetic energy is radiated through the structure. The broadband energy is sensed on diagnostic sensors, the outputs of which are paralleled with or fed directly (at the discretion of the designer) to the arc detection system filters. The filters pass energy which falls within the frequency band of interest, while rejecting other signals such as the accelerator fundamental rf operating frequency. The output from each filter bank is then fed to an rf detector which produces a DC level output proportional to the amplitude of the signal (broadband noise) received. The outputs from the rf detectors are then fed to processing logic (which may be either hardwired logic or a digital controller). When the selected set of rf detectors becomes active, the processor declares an arc condition and produces appropriate signals to inform the main system processor and initiate protective action as earlier described.

I claim:

1. An electromagnetic arc detection system for a particle beam accelerator which functions with an operating particle beam accelerator structure to separate and detect low frequency fundamental radio frequency energy from the fundamental radio frequency energy of said operating particle beam accelerator structure, said low frequency fundamental radio frequency energy having simultaneous excitation of multiple frequency bands are detectable and classifiable by said electromagnetic arc detection system as characteristics of an arc phenomena which includes broadband electromagnetic energy being radiated throughout said particle beam accelerator structure, said electromagnetic arc detection system comprising:

(i) first signal lines connected to and extended from a plurality of diagnostic sensors of said operating particle beam accelerator structure to a plurality of electrical filter circuits;

(ii) a plurality of electrical filter circuits having input and output terminals, said input terminals of each of said electrical filter circuits connected electrically to each terminal end of said first signal lines;

(iii) second signal lines connected to and extended from each of said output terminals of each of said electrical filter circuits for passing radio frequency signals to radio frequency detectors which produce direct current levels proportional to the strength of the amplitude of said radio frequency signals received;

(iv) radio frequency detectors having input and output terminals, said input terminals of each of said radio frequency detectors connected electrically to each terminal end of said second signal lines;

(v) third signal lines connected to and extended from each of said output terminal of said radio frequency detectors to a processor having input and output terminals for receiving, producing, and transmitting appropriate signals to a main system processor; and, (vi) a processor having input and output terminals, each of said input terminals of said processor connected electrically to each terminal end of said third signal lines which transmits outputs from said radio frequency detectors to said processor for processing to produce appropriate signals based on predetermined levels of broadband noise which falls within frequency bands of interest for declaring arc condition based on direct current levels received from each of said radio frequency detectors, said processor producing and transmitting appropriate signals for declaring an arc condition for said operating particle beam accelerator structure through said output terminals to a main system processor which initiates protective action to shut down said operating particle beam accelerator.

2. The electromagnetic arc detection system as defined in claim 1 wherein said electrical filter circuits are bandpass type.

3. The electromagnetic arc detection system as defined in claim 2 wherein said radio frequency detectors detect the increase in broadband electromagnetic energy radiated through said operating particle beam accelerator structure as an arc condition begins to form based on radio frequency spectrum at frequencies below 10 megahertz.

* * * * *